United States Patent
Sachdev et al.

(10) Patent No.: US 7,670,961 B2
(45) Date of Patent: Mar. 2, 2010

(54) REDUCTION OF CRACKING IN LOW-K SPIN-ON DIELECTRIC FILMS

(75) Inventors: Harbans Singh Sachdev, Hopewell Junction, NY (US); Howard Shillingford, Poughkeepsie, NY (US); Garkay Joseph Leung, Wappingers Falls, NY (US); Mary Matera-Longo, Modena, NY (US); John Rapp, Poughkeepsie, NY (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 11/629,058

(22) PCT Filed: Jun. 8, 2005

(86) PCT No.: PCT/IB2005/051885
§ 371 (c)(1),
(2), (4) Date: Aug. 15, 2007

(87) PCT Pub. No.: WO2005/122227
PCT Pub. Date: Dec. 22, 2005

(65) Prior Publication Data
US 2008/0026594 A1    Jan. 31, 2008

Related U.S. Application Data

(60) Provisional application No. 60/578,251, filed on Jun. 8, 2004.

(51) Int. Cl.
*H01L 21/31* (2006.01)
*H01L 21/469* (2006.01)
(52) U.S. Cl. ............... 438/763; 438/782; 257/E21.487; 257/E21.58

(58) Field of Classification Search .................. 438/958, 438/763, 782; 257/E21.264, E21.487, E21.576, 257/E21.58
See application file for complete search history.

(56) References Cited

U.S. PATENT DOCUMENTS 5,693,566 A * 12/1997 Cheung ...................... 438/624

(Continued)

FOREIGN PATENT DOCUMENTS

| EP | 0 883 164 | 12/1998 |
|----|-----------|---------|
| GB | 2320809 A | 1/1998  |

OTHER PUBLICATIONS

Jain V et al: "Internal Passivation for Suppression of Device Instabilities Induced by Backend Processes"; Reliability Physics Symposium 1992; 30th Annual Proceedings; International San Diego CA USA; Mar. 31-Apr. 2, 1992 NY; pp. 11-15.

*Primary Examiner*—Caridad M Everhart
(74) *Attorney, Agent, or Firm*—Peter Zawilski

(57) ABSTRACT

The present invention relates to a process that minimizes the cracking of low-k dielectric polymers. In an example embodiment, on a semiconductor substrate (200), there is a method of forming a composite dielectric disposed on a metal layer passivated with plasma deposited silicon oxide $SiO_x$. The method comprises depositing a first layer of a first predetermined thickness of a spin-on dielectric on the metal layer protected with a plasma deposited silicon oxide $SiO_x$. Next a thin stress relief layer of a second predetermined thickness is disposed on the first layer of spin-on-dielectric. Upon the thin stress-relief layer, a second layer of a third predetermined thickness of spin-on dielectric is deposited. Low-k spin-on dielectrics may include hydrogen silsequioxane (HSQ) and methyl silsequioxane (MSQ).

24 Claims, 2 Drawing Sheets

U.S. PATENT DOCUMENTS

| | | | |
|---|---|---|---|
| 5,759,906 A * | 6/1998 | Lou | 438/623 |
| 5,891,800 A * | 4/1999 | Ben-Guigui et al. | 438/631 |
| 5,955,200 A * | 9/1999 | Chang et al. | 428/426 |
| 6,083,850 A * | 7/2000 | Shields | 438/763 |
| 6,169,040 B1 | 1/2001 | Mifuji et al. | |
| 6,184,123 B1 * | 2/2001 | Ge et al. | 438/624 |
| 6,211,097 B1 * | 4/2001 | Chen et al. | 438/787 |
| 6,239,034 B1 | 5/2001 | Yang et al. | |
| 6,656,778 B1 * | 12/2003 | Chen et al. | 438/159 |
| 2002/0163062 A1 * | 11/2002 | Wang et al. | 257/641 |
| 2003/0148631 A1 * | 8/2003 | Kuo et al. | 438/782 |
| 2004/0082194 A1 | 4/2004 | Wang et al. | |

* cited by examiner

REDUCTION OF CRACKING IN LOW-K SPIN-ON DIELECTRIC FILMS

CROSS REFERENCE TO RELATED APPLICATIONS

This application claims priority from International Application (Number PCT/IB2005/051885) filed on Jun. 8, 2005 and U.S. Provisional Application (No. 60/578,251) filed on Jun. 8, 2004 both of which are incorporated herein by reference in their entirety.

FIELD OF INVENTION

The invention relates to semiconductor processing. More particularly this invention relates to a process that minimizes the cracking of low-k dielectric polymers.

BACKGROUND

The electronics industry continues to rely upon advances in semiconductor technology to realize higher-function devices in more compact areas. For many applications realizing higher-functioning devices requires integrating a large number of electronic devices into a single silicon wafer. As the number of electronic devices per given area of the silicon wafer increases, the manufacturing process becomes more difficult.

Many varieties of semiconductor devices have been manufactured having various applications in numerous disciplines. Such silicon-based semiconductor devices often include metal-oxide-semiconductor field-effect transistors (MOSFET), such as p-channel MOS (PMOS), n-channel MOS (NMOS) and complementary MOS (CMOS) transistors, bipolar transistors, BiCMOS transistors. Such MOSFET devices include an insulating material between a conductive gate and silicon-like substrate; therefore, these devices are generally referred to as IGFETs (insulated-gate FET).

Each of these semiconductor devices generally includes a semiconductor substrate on which a number of active devices are formed. The particular structure of a given active device can vary between device types. For example, in MOS transistors, an active device generally includes source and drain regions and a gate electrode that modulates current between the source and drain regions.

Furthermore, such devices may be digital or analog devices produced in a number of wafer fabrication processes, for example, CMOS, BiCMOS, Bipolar, etc. The substrates may be silicon, gallium arsenide (GaAs) or other substrate suitable for building microelectronic circuits thereon.

As devices scale down to the sub-micron level, electrical characteristics such as capacitance that were negligible in devices having dimensions in multiples of microns, have become significant. For example, in a sub-0.20 μm process there has been a renewed interest in materials with a low dielectric constant (i.e., "low k").

A goal in processing sub-micron devices is to maintain a level of gate capacitance while minimizing the gate-to-source and gate-to-drain capacitance. As the oxide is made thinner the capacitance increases as shown in the relationship:

$$C_{ox} = \frac{\varepsilon_o \varepsilon_{SiO_2}}{t_{ox}} \cdot A,$$

where
A=area of gate
$\varepsilon_{SiO_2}$=dielectric constant (or relative permittivity of $SiO_2$ taken as 3.9)
$t_{ox}$=oxide thickness The gate-to-drain capacitance is especially critical for transistor performance as it is amplified during switching due to the Miller effect. For example, in a series of logic stages, the equivalent capacitive loading to the previous logic stage is the gate-to-source capacitance multiplied by a factor of 1 plus the gain of the transistor. If the transistor has a gain of 100, the observed input capacitance would be 101 times the gate-to-drain capacitance. Consequently, it is desirable to not alter the parameters that tend to increase that capacitance. Therefore, using a dielectric material having a lower dielectric constant lowers the capacitance. It is advantageous to use lower k materials throughout the integrated circuit design where possible to minimize the parasitic capacitance.

There is an increasing demand in the semiconductor industry for improved insulating materials with lower dielectric constants. The requirement for low k materials for sub-quarter micron and smaller devices has renewed the interest in spin-on dielectrics such as methyl silsesquioxane (MSQ) and hydrogen silsesquioxane (HSQ). HSQ has a dielectric constant of from 2.8-2.9. The empirical formula of HSQ is $(HSiO_{3/2})_n$. HSQ may be used as an inter-level dielectric for building multi-level semiconductor devices. Low-k materials usually are relatively less dense than silicon oxides or silicon nitrides. Some of these low-k materials are made porous by design. The porosity of these materials tends to degrade their mechanical strength.

SUMMARY OF THE INVENTION

There exists a need to provide for the improved mechanical strength of polymer material that has been spin-coated over metal lines. In the building of a multi-level semiconductor device it is necessary to assure the integrity of the structure at each process step so as to exclude chemical contamination. Depositing the dielectric as a three-layer composite lessens the likelihood of the cracking of hydrosilsesquioxane low-k dielectric. Two layers of HSQ or other suitable low-k dielectric with an interposing thin tough stress relief layer of a silicon-containing dielectric prevents stress cracking and increases the mechanical strength of the inter-metal dielectric and thereby improves device integrity.

In example embodiment according to the present invention, on a semiconductor substrate, there is a method of forming a composite dielectric disposed on a metal layer passivated with plasma deposited silicon oxide ($SiO_x$). The method comprises, depositing a first layer of a first predetermined thickness of a spin-on dielectric on the metal layer protected with a plasma deposited silicon oxide. Upon the spin-on dielectric, a thin stress relief layer of a second predetermined thickness is disposed thereon. A second layer of a third predetermined thickness of a spin-on dielectric is deposited over the stress relief layer. A feature of this embodiment includes the curing of the first and second layers of spin-on dielectric after deposition.

In another example embodiment, there is a method of forming an inter-level insulation between metal lines in a semiconductor device on a wafer substrate. The method comprises depositing a first silicon oxide layer at a first-predetermined thickness through PECVD onto the metal lines and spaces between the metal lines. A first layer of a low-k dielectric polymer at a second predetermined thickness, is spun onto the silicon oxide layer. In a nitrogen ambient, the first layer of low-dielectric polymer is cured. A second silicon oxide layer at a third predetermined thickness through PECVD is deposited onto the first layer of low-k dielectric polymer. Upon the second silicon oxide layer, a second layer of low-k dielectric polymer, at a fourth predetermined thickness is spun onto the second silicon oxide layer. The second layer of low-k dielectric polymer is cured in a nitrogen ambient. Upon the second layer of low-k dielectric polymer, a layer of PETEOS at a fifth predetermined thickness is deposited.

In yet another embodiment, there is a semiconductor device having a dielectric structure covering a metal layer passivated with a layer of silicon oxide. The dielectric structure comprises a first low-k dielectric layer of a first thickness. Covering the first low-k dielectric, there is a stress relief layer of a second thickness. A second layer of low-k dielectric of a third thickness covers the stress-relief layer. A feature of this embodiment includes an insulating layer disposed upon the second layer of low-k dielectric.

The above summaries of the present invention are not intended to represent each disclosed embodiment, or every aspect, of the present invention. Other aspects and example embodiments are provided in the figures and the detailed description that follows.

BRIEF DESCRIPTION OF THE DRAWINGS

The invention may be more completely understood in consideration of the following detailed description of various embodiments of the invention in connection with the accompanying drawings, in which.

DETAILED DESCRIPTION

The present invention has been found to be useful in overcoming challenges associated with using low-k polymer spin-on dielectrics.

Figure 1:
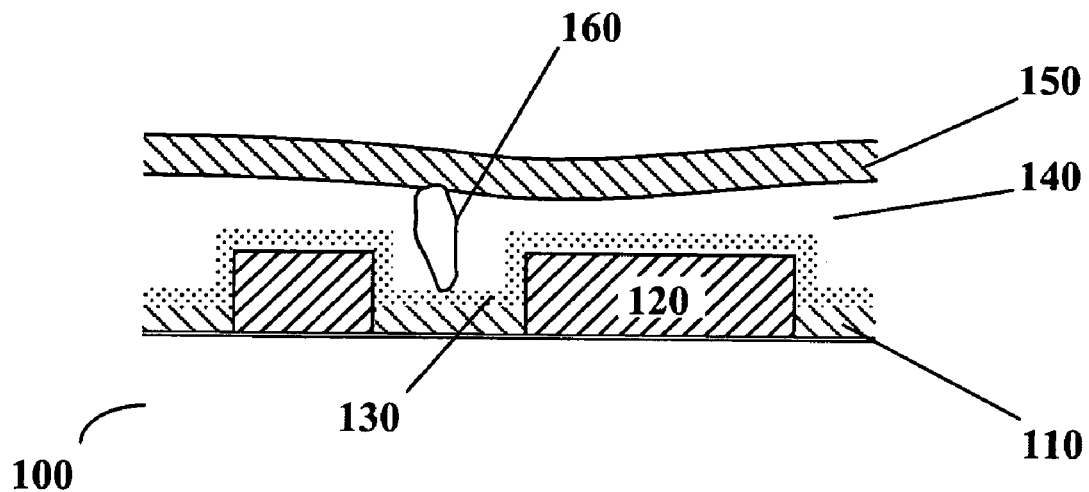
FIG. 1 (Prior Art) illustrates in cross-section cracking of a conventional process.

In an example process for building CMOS devices, the use of low-k dielectric hydrosilsesquioxane polymer (HSQ) is called for. HSQ is spin coated over HRI (high refractive index) silicon oxide $SiO_x$ (x<2) that has been applied by plasma deposition process over metal lines. The dielectric layer is baked in a nitrogen ambient at 420° C. according to an example procedure which follows. An HSQ coated wafer is heated on a hot plate under nitrogen sequentially at 150° C. for 60 sec., 250° C. for 60 sec. and 350° C. for 60 sec. Finally it is baked under nitrogen at 420° C. in a furnace for 15-30 min. The polymers FOx-25 and FOx-24 (of DOW CORNING) in different dilutions produce films ranging in thickness from 7000 Angstroms to 2000 Angstroms. Studies with FOx-25 and FOx-24 films have shown that upon curing films greater than 5000 Angstroms in thickness have a tendency to develop cracks. Refer to FIG. 1. In an example of conventional process, a structure 100 depicts insulator layer 110 of PETEOS (plasma-enhanced tetraethoxysilane) deposited by plasma enhanced chemical vapor deposition) and metal lines 120. The thickness of the PETEOS is about 0.4 μm. Depending upon a specific process it may be more or less. A first layer of a high-refractive index (HRI) film 130 of about the same thickness as PETEOS or less (about 0.2 μm to about 0.4 μm) has been blanket deposited over the substrate consisting of PETEOS 110 and metal lines 120. This HRI (high refractive index) film 130 has a silicon oxide with higher proportion of silicon atoms than represented by the formula $SiO_x$ (where x<2). HRI silicon has Si—Si bonds and is well known in the art to be a getter of moisture.

High Refractive Index (HRI) silicon is silicon having a higher proportion of Si—Si bonds. The higher proportion of Si—Si bonds results in a higher refractive index. However, HRI silicon is known to have lower stress, lower dielectric constant, more desirable mechanical properties than silicon oxynitride or silicon nitride. $SiO_x$ or, $SiO_2$ or undoped silicon oxide is also preferred over nitrides for the same reasons. With respect to the present invention, in a three-layer composite it is more important to have low dielectric constant and superior mechanical properties. HRI silicon is deposited from a mixture of $SiH_4$, $N_2O$, and $N_2$ by plasma enhanced chemical vapor deposition process known as PECVD. Over the HRI film, spin-on-glass (SOG) layer 140 of about 0.4-1.0 μm is spin applied and baked to 420° C. as described above. In the particular process, this SOG layer may be FOx-25 or FOx-24. A second PETEOS layer 150 of about 0.4 μm is deposited upon the SOG layer 140. For building the next level, contacts are made by reactive ion etching of PETEOS. Blanket metal is deposited. A pattern is delineated and HRI deposition repeated, which is followed by spin application of low-k SOG for second level build. However, the SOG films with a thickness greater than 0.5 μm have a tendency to develop cracks, as shown in an example crack 160. To build a multi-level semiconductor device, the integrity of the structure at each process step has to be assured to prevent chemical contamination.

It has been shown that the cracking associated with MSQ and HSQ low-k dielectrics can be mitigated by depositing the low k inter-metal dielectric SOG as a three layer composite which includes two distinct layers of a low-k insulator with a thin interposing stress release layer, the stress release layer being a plasma-deposited silicon-containing layer having superior mechanical properties.

Figure 2:
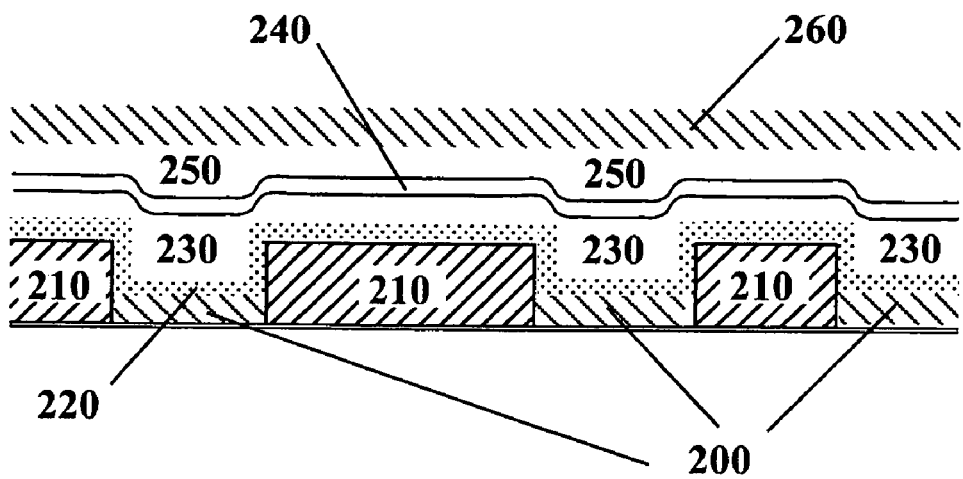
FIG. 2 is a cross-section of an example three-layer composite structure according to the present invention.

Refer to FIG. 2. In an example embodiment according to the present invention, metal lines 210 have been rendered onto a PETEOS substrate layer 200. This is followed by the deposition of about 0.2 μm to about 0.4 μm of HRI silicon oxide 220 as described above. A low-k dielectric layer 230, such as HSQ (about 0.2 μm to about 0.55 μm) is spin coated over 220 and baked under nitrogen at 420° C. (as shown in the process exemplified earlier as in FIG. 1). Over the low-k dielectric layer 230, a thinner layer of HRI silicon oxide dielectric layer 240 is deposited by PECVD. This layer is preferably in the thickness range of about 0.025 μm to about 0.1 μm. Such layers may also include silicon-rich oxide or silicon dioxide.

Where the minimizing of the dielectric constant is not a concern, in an alternative process, silicon nitride and silicon oxynitride may be used. However, silicon nitride and silicon oxy nitride have higher stress and also have higher dielectric constant. In some example processes, these properties may be acceptable.

Over the HRI silicon oxide layer 240, a second layer of low-k dielectric HSQ 250 (about 0.2 μm to about 0.55 μm) is spin applied and cured to 420° C. as before. This is followed by deposition of PETEOS (about 0.4 μm) 260, or other suitable silicon oxide type dielectric, upon the second layer of low-k dielectric 250, to provide a surface for the next metal level build. Though not shown here, subsequent metal deposition and pattern etching and sequential deposition of the same set of dielectrics may be used as explained earlier. In this example, a single metal layer is shown; however, the present invention is not so limited. Modern semi-conductor devices have multiple layers. Some may have two, others three, and others three on upwards.

In a particular example process, a metal-low-k insulator structure with an insulator thickness over a micron is fabricated by spin coating a film of FOx-25 of about 0.51 μm over HRI silicon oxide passivated metal lines. The structure is baked at a temperature of about 420° C. under nitrogen according to a protocol specified for the FOx. Over the low-k film was plasma deposited (from $SiH_4+N_2O+N_2$) about 0.052 μm high refractive index (HRI) $SiO_x$ (x<2) dielectric at about 400° C.

This is followed by application of a second layer of FOx-25 of about 0.52 μm, which was cured to about 420° C. as before. The composite dielectric layer of about 0.51+0.052+0.52=1.082 microns in thickness thus deposited survives subsequent process steps without cracking In another example process, a similar low-k composite structure with a thin middle layer of plasma deposited undoped silicon glass (USG) is discovered also to withstand subsequent process steps without cracking. USG usually denoted as $SiO_2$ or $SiO_x$ is also derived from $SiH_4+N_2O+N_2$, but is deposited at higher frequency than HRI. It has comparable mechanical properties. USG has a greater oxygen content than that of HRI. However, different power settings assure more complete oxidation of SiH4 molecules ($SiH_4+N_2O+N_2 \rightarrow SiO_2+H_2O+N_2$) to give a structure more similar to HRI material may be used in three-layer composite but not over metallurgy and PETEOS where the HRI with its Si—Si bonds can soak up water.

Figure 3:
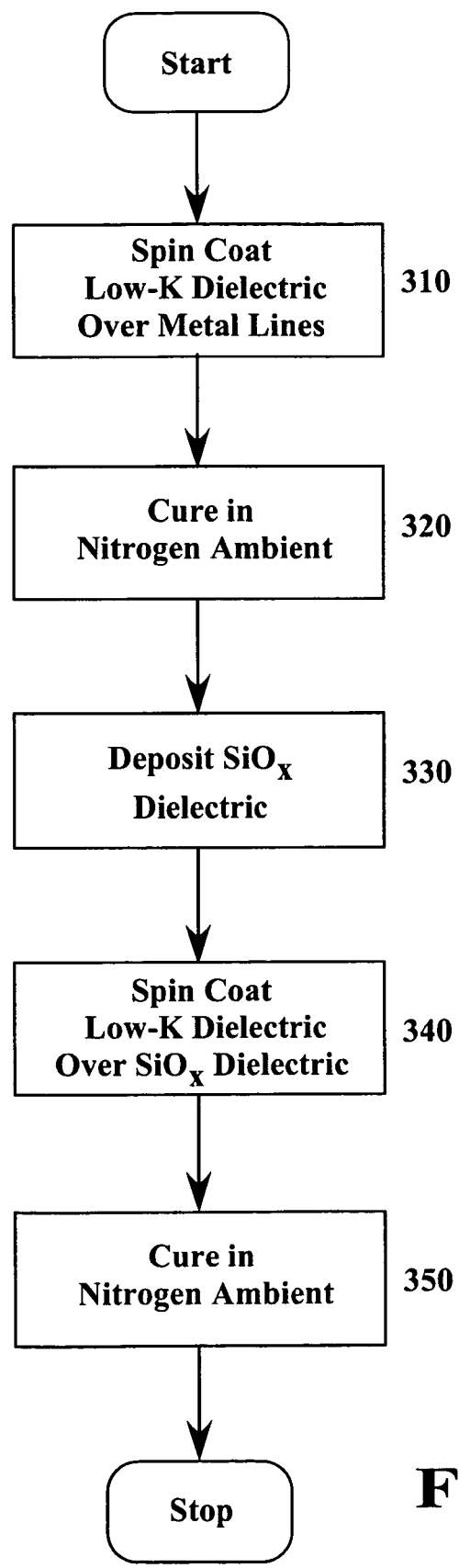
FIG. 3 is a flowchart of an example process according to the present invention.

FIG. 3 is flowchart of an example process according to the present invention. For a given metal layer (of which there may be more than one in a modern process) coated over by plasma-enhanced deposition of high refractive index (HRI) glass, a layer of low k dielectric low-k dielectric 310 is spin applied. The low-k film is cured in the nitrogen ambient 320. After the curing, a very thin layer of a silicon-containing dielectric is deposited 330 is deposited. Various oxides of silicon may be used. Enhanced plasma deposition or chemical vapor deposition (CVD) are some ways in which the silicon-containing dielectric be applied. A second spin coat of low-k dielectric is applied over the silicon-containing dielectric 340. The second spin coat of low-k dielectric is cured in nitrogen ambient 350. For multiple metal layers, an additional dielectric is deposited on the second spin coat of low-k dielectric 350. This additional dielectric may be PETEOS or other suitable material. Refer to FIG. 2. The process is then repeated.

While the present invention has been described with reference to several particular example embodiments, those skilled in the art will recognize that many changes may be made thereto without departing from the spirit and scope of the present invention, which is set forth in the following claims.

The invention claimed is:

1. On a semiconductor substrate, a method of forming a composite dielectric disposed on a metal layer passivated with a silicon oxide $SiO_x$, the method comprising:
   depositing a first layer of a first predetermined thickness of a spin-on inorganic dielectric on the metal layer passivated with a deposited silicon oxide $SiO_x$, wherein the deposited silicon oxide $SiO_x$ includes high refractive index silicon oxide;
   forming a thin stress relief layer of a second predetermined thickness disposed on the first layer of spin-on dielectric; and
   depositing a second layer of a third predetermined thickness of a spin-on dielectric over the stress relief layer.

2. The method of claim 1, wherein depositing the first layer of spin-on dielectric further includes curing the first layer of spin-on dielectric after deposition; and wherein depositing the second layer of spin-on dielectric further includes curing the second layer of spin-on dielectric after deposition.

3. The method of claim 1 wherein the stress relief layer includes: plasma deposited silicon dioxide, silicon-rich oxide, and $Si_xO_y$.

4. The method of claim 1 wherein, the stress relief layer is deposited by one of the following: chemical vapor deposition (CVD) and plasma-enhanced chemical vapor deposition (PECVD).

5. The method of claim 1, wherein the first layer is a film of flowable oxide inorganic polymer, the first predetermined thickness being about 0.51 μm, the first layer being baked at a temperature of about 420° C. in a nitrogen ambient, the thin stress relief layer being a high refractive index $SiO_{x<2}$ dielectric, the second predetermined thickness being about 0.052 μm, the thin stress relief layer being plasma deposited at a temperature about 400° C., the second layer being a flowable oxide inorganic polymer, the third predetermined thickness being about 0.52 μm, the second layer being cured at a temperature of about 420° C., and wherein the composite dielectric survives subsequent process steps without cracking.

6. The method of claim 1, wherein the stress relief layer includes silicon-rich oxide.

7. The method of claim 1, wherein the stress relief layer includes silicon nitride.

8. The method of claim 1, wherein the stress relief layer includes silicon oxy nitride.

9. A method of manufacturing a semiconductor device, the method comprising:
   depositing a first layer of a first predetermined thickness of a low-k spin-on inorganic dielectric on the metal layer passivated with silicon oxide $SiO_x$ and curing the first layer of spin-on dielectric in a nitrogen ambient, wherein the silicon oxide $SiO_x$ includes high refractive index silicon oxide;
   forming by plasma deposition a stress relief layer of a second predetermined thickness disposed on the first layer of spin-on dielectric; and
   depositing a second layer of a third predetermined thickness of a spin-on dielectric on the stress relief layer and curing the second layer of spin-on dielectric in a nitrogen ambient.

10. The method of claim 1 wherein the spin-on dielectric is a spin-on-glass (SOG) including at hydrogen silsesquioxane.

11. The method of claim 10 where the thickness of each spin-on dielectric layer has a thickness in the range about of 0.2 μm to about 0.55 μm.

12. The method of claim 9, wherein the spin-on dielectric includes hydrogen silsesquioxane (HSQ).

13. The method of claim 9, wherein the stress relief layer includes at least one of the following: silicon dioxide or silicon-rich oxide $SiO_{x<2}$.

14. A method of forming an inter-level insulation between metal lines in a semiconductor device on a wafer substrate, the method comprising:
   depositing a first silicon oxide layer at a first-predetermined thickness through plasma-enhanced chemical vapor deposition (PECVD) onto the metal lines and spaces between the metal lines, wherein the first silicon oxide layer includes high refractive index silicon oxide;
   spinning a first layer of a low-k inorganic dielectric polymer onto the first silicon oxide layer, at a second predetermined thickness;

curing the first layer of low-k dielectric polymer in a nitrogen ambient;

depositing a second silicon oxide layer at a third-predetermined thickness through PECVD onto the first layer of low-k dielectric polymer;

spinning a second layer of a low-k dielectric polymer onto the silicon oxide layer, at a fourth predetermined thickness;

curing the second layer of low-k dielectric polymer in a nitrogen ambient; and depositing a plasma-enhanced tetraethoxysilane (PE-TEOS) layer at a fifth pre-determined thickness onto the second layer of low-k dielectric polymer.

15. The method of claim 14, wherein the second silicon oxide layer includes at least one of the following: high refractive index silicon and undoped silicon glass.

16. The method of claim 15 wherein the first layer of low-k dielectric polymer and the second layer of low-k dielectric polymer include hydrogen silsesquioxane.

17. The method of claim 16 wherein, the first-predetermined thickness of the first silicon oxide layer in the range of about 0.2 µm to about 0.4 µm;

the second-predetermined thickness of the first layer of a low-k dielectric polymer in the range of about 0.2 µm to about 0.8 µm;

the third-predetermined thickness of the second silicon oxide layer in the range of 0.02 µm to about 0.15 µm;

the fourth-predetermined thickness of the second layer of a low-k dielectric polymer in the range of about 0.2 µm to about 0.8 µm; and the fifth-predetermined thickness of the PETEOS layer in the range of about 0.3 µm to about 0.7 µm.

18. The method of claim 17 wherein curing in a nitrogen ambient includes, heating the wafer substrate on its underside at about 150° C. for about one minute;

further heating the wafer substrate on its underside at about 250° C. for about one minute;

further heating the wafer substrate on its underside at about 350° C. for about one minute; and baking the wafer substrate in a furnace at about 420° C. for about 15 minutes to about 30 minutes.

19. A semiconductor device having a dielectric structure disposed upon a metal layer passivated with a first layer of silicon oxide, the dielectric structure comprising:

a first low-k inorganic dielectric layer of a first thickness;

a stress relief layer of a second thickness disposed upon the first low-k dielectric layer, and a second layer of low-k dielectric of a third thickness disposed upon the stress-relief layer, wherein the first layer of silicon oxide includes high refractive index silicon oxide.

20. The semiconductor device as recited in claim 19, wherein the insulating layer includes plasma-enhanced tetraethoxysilane (PETEOS).

21. The dielectric structure as recited in claim 19 wherein, the stress relief layer includes at least one of the following, silicon dioxide, silicon-rich oxide and $Si_xO_y$.

22. The dielectric structure as recited in claim 19, wherein the stress relief layer is comprised of material deposited by one of the following: chemical vapor deposition (CVD) and plasma-enhanced chemical vapor deposition (PECVD).

23. The semiconductor device as recited in claim 19, further comprising, an insulating layer disposed upon the second layer of low-k dielectric.

24. The semiconductor device as recited in claim 23 wherein the first thickness of the first layer of a low-k dielectric in the range of about 0.2 µm to about 0.8 µm;

the second thickness of the stress relief layer in the range of 0.02 µm to about 0.15 µm;

the thickness of the second layer of a low-k dielectric in the range of about 0.2 µm to about 0.8 µm; and the thickness of the insulating layer in the range of about 0.3 µm to about 0.7 µm.

* * * * *